United States Patent [19]
Ochi et al.

[11] Patent Number: 5,389,798
[45] Date of Patent: Feb. 14, 1995

[54] HIGH-SPEED SEMICONDUCTOR DEVICE WITH GRADED COLLECTOR BARRIER

[75] Inventors: Seiji Ochi; Hirotaka Kizuki, both of Itami, Japan

[73] Assignee: Mitsubishi Denki Kabushiki Kaisha, Tokyo, Japan

[21] Appl. No.: 955,275

[22] Filed: Oct. 1, 1992

[30] Foreign Application Priority Data

Oct. 2, 1991 [JP] Japan ................... 3-255118
Jul. 21, 1992 [JP] Japan ................... 4-217251

[51] Int. Cl.$^6$ ................ H01L 29/205; H01L 29/72
[52] U.S. Cl. ........................... 257/25; 257/23; 257/191; 257/198
[58] Field of Search ............ 257/198, 191, 23, 25, 257/26

[56] References Cited

U.S. PATENT DOCUMENTS

| | | | |
|---|---|---|---|
| 4,149,174 | 4/1979 | Shannon | 357/13 |
| 4,847,666 | 7/1989 | Heremans et al. | 357/16 |
| 4,868,418 | 9/1989 | Imamura et al. | 257/198 |
| 4,987,458 | 1/1991 | Gaylord | 257/26 |
| 5,010,382 | 4/1991 | Katoh | 357/34 |
| 5,111,265 | 5/1992 | Tanaka | 257/25 |

FOREIGN PATENT DOCUMENTS

| | | | |
|---|---|---|---|
| 0134069 | 3/1985 | European Pat. Off. | |
| 0177374 | 4/1986 | European Pat. Off. | |
| 0186301 | 7/1986 | European Pat. Off. | |
| 0238406 | 9/1987 | European Pat. Off. | 257/25 |
| 0314836 | 5/1989 | European Pat. Off. | |
| 61-176163 | 8/1986 | Japan | 257/25 |
| 62-203371 | 9/1987 | Japan | |
| 63-284870 | 11/1988 | Japan | 257/25 |
| 193166 | 4/1989 | Japan | |
| 2213167 | 8/1990 | Japan | |
| 2191037 | 12/1987 | United Kingdom | |

OTHER PUBLICATIONS

Uenohara et al, "Analysis Of Electron Wave Reflectivity And Leakage Current Of Multi Quantum Barrier: MGB", Society of Electronic Information Communication, vol. J70–C, No. 6, 1987, pp. 851–857.

Yokoyama et al, "A New Functional, Resonant-Tunneling Hot Electron Transistor (RHET)", Japanese Journal of Applied Physics, vol. 24, No. 11, 1985, pp. L853–L854.

Primary Examiner—Jerome Jackson
Attorney, Agent, or Firm—Leydig, Voit & Mayer

[57] ABSTRACT

A high-speed semiconductor device includes an emitter layer serving as an injection source of hot electrons and a collector barrier layer disposed between a base layer and a collector layer. The potential profile of the collector barrier layer gradually varies from a region in the vicinity of the boundary between the base layer and the collector barrier layer whereby reflection of electrons at the collector barrier layer is significantly reduced. Therefore, current density in the ON state of the device is increased without damaging the high speed characteristics of the device, and current density in the OFF state of the device is decreased, resulting in a high-performance and high-speed semiconductor device.

4 Claims, 20 Drawing Sheets

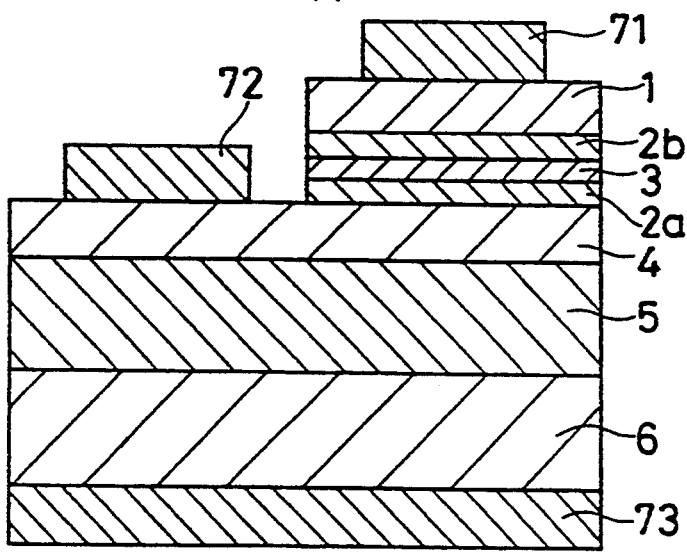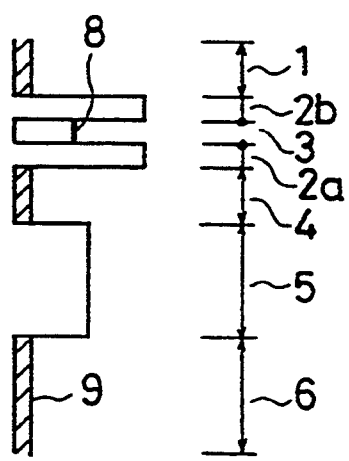
FIG.20(a) (PRIOR ART)
FIG.20(b) (PRIOR ART)

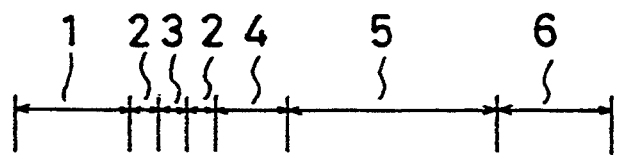
FIG.21(a)
(PRIOR ART)
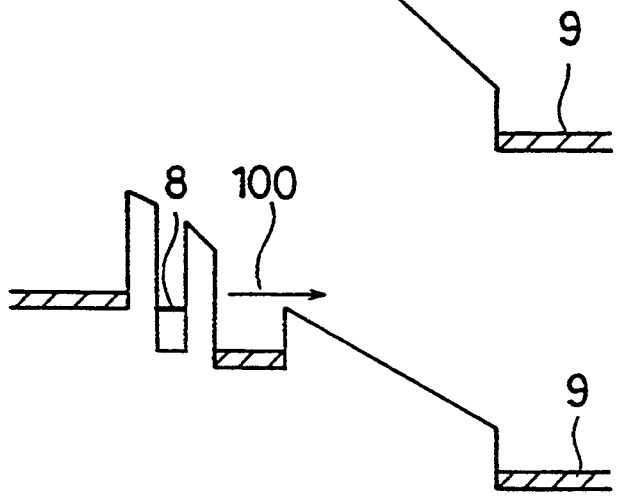
FIG.21(b)
(PRIOR ART)
FIG.21(c)
(PRIOR ART)

HIGH-SPEED SEMICONDUCTOR DEVICE WITH GRADED COLLECTOR BARRIER

FIELD OF THE INVENTION

The present invention relates to a high-speed semiconductor device in which carriers are injected into a base region through a tunnel barrier or a resonant tunnel barrier, and a method of producing the semiconductor device.

The invention also relates to a bipolar semiconductor device including a heterojunction between an emitter and a base, that can increase current amplification factor.

BACKGROUND OF THE INVENTION

High speed semiconductor devices utilizing ballistic transmission of hot electrons injected into a base region have been proposed. Recently, a new type high speed semiconductor device utilizing a negative resistance caused by a resonant tunneling effect and the high-speed nature of a hot electron has been proposed and attracted attention. FIGS. 20(a) and 20(b) are a schematic cross section and an energy band diagram, respectively, illustrating a resonanttunneling hot electron transistor (hereinafter referred to as RHET) disclosed in, for example, Japanese Published Patent Application No. 62-203371. In FIG. 20(a), there are successively disposed on an n type GaAs collector layer 6, an i type $Al_yGa_{1-y}As$ collector barrier layer 5, an n type GaAs base layer 4, a lower intrinsic $Al_xGa_{1-x}As$ potential barrier layer 2a, an intrinsic GaAs well layer 3, an upper intrinsic $Al_xGa_{1-x}As$ potential barrier layer 2b, and an n+ type GaAs emitter layer 1. An emitter electrode 71, a base electrode 72, and a collector electrode 73 are disposed on the emitter layer 1, the base layer 4, and the rear surface of the collector layer 6, respectively. Reference numeral 8 designates a resonance energy level and reference numeral 9 designates the Fermi level. The well layer 3 is sandwiched between the two potential barriers 2a and 2b, and the resonance level 8 is in the well layer 3, whereby a resonant tunneling barrier on the emitter side is produced. The well layer 3 is about 6 nm thick and each of the potential barriers 2a and 2b is about 5 nm thick.

FIGS. 21(a) to 21(c) are energy band diagrams for explaining the operating principle of the RHET. In the figures, the same reference numerals as in FIGS. 20(a) and 20(b) designate the same or corresponding parts, and reference numeral 100 designates hot electrons. A constant voltage $V_{EC}$ is applied between the emitter layer 1 and the collector layer 6.

FIG. 21(a) shows an energy band diagram in a state where the voltage $V_{BE}$ between the emitter layer 1 and the base layer 4 is zero. In this state, the energy of the resonance level 8 in the well layer 3 is higher than the energy of the Fermi level 9 in the emitter layer 1, so that no resonant tunneling from the emitter layer 1 to the base layer 4 occurs and no current flows.

However, as shown in FIG. 21(b), when a base voltage is applied so that the energy level at the emitter side is equivalent to the resonance level 8 in the well layer 3 ($V_{BE}=V_R$), electrons are injected into the base region due to the resonant tunneling. These electrons, i.e., hot electrons 100, are ballistically transmitted through the base layer 4 and the collector barrier layer 5 to reach the collector layer 6. At this time, current flows between the emitter layer 1 and the collector layer 6, and the RHET is turned on.

Thereafter, as shown in FIG. 21(c), when the base voltage $V_{BE}$ is increased to lower the energy of the resonance level 8 lower than the edge of the conduction band of the emitter layer 1, the resonant tunneling disappears, and the RHET is turned off.

In this way, the voltage/current characteristic of the RHET exhibits differential negative resistance with a peak current value at the base voltage $V_{BE}=V_R$. When the RHET is used as a multivalued logic circuit, the ratio of the current density in the ON state to the current density in the OFF state, i.e., a P/V (peak/valley) ratio should be sufficiently high. In practical use, a P/V ratio of 20:1 is required. During operation, the collector barrier layer 5 sufficiently insulates the base layer 4 from the collector layer 6, whereby only unscattered hot electrons 100 reach the collector layer 6 with high efficiency. More specifically, if the collector barrier layer 5 is designed so that the energy thereof may be equivalent to the resonance level 8 in the state of FIG. 21(b), electrons, which have been scattered in the base layer 4 and have lost energy, do not pass through the collector barrier layer 5 and only the unscattered hot electrons 100 reach the collector layer 6. That is, the high-speed nature of the RHET is realized only when the hot electrons 100 are used for the operation of the transistor. Because of the above-described differential negative resistance characteristics and the high-speed nature, the RHET is expected to be used as a high-speed multivalued logic circuit or a high-speed oscillator.

FIG. 23(a) is an energy band diagram of a prior art heterojunction bipolar transistor (hereinafter referred to as HBT) described in "Very High Speed Compound Semiconductor Device", written by Masamichi Ohmori, published on 1986 by Baifu-kan. FIG. 23(b) is a schematic cross section of the HBT. In the figures, there are successively disposed on a GaAs substrate 30, an n type GaAs collector layer 33, a p type GaAs base layer 32, and an n type AlGaAs emitter layer 31. A collector electrode 93, a base electrode 92, and an emitter electrode 91 are disposed on the collector electrode 33, the base electrode 32, and the emitter electrode 91, respectively. In addition, reference numerals 150 and 151 designate holes and electrons, respectively.

In the HBT, since the emitter-base junction is a heterojunction and the emitter is a wide energy band gap emitter, reverse injection of minority carriers from the base to the emitter is reduced, so that the emitter injection efficiency is high, resulting in a high current gain. Even if the base conductivity is increased, the high current gain is maintained, so that the base resistance is reduced. Accordingly, the HBT is a transistor capable of high-power and high-speed operation with high current gain.

In the above-described prior art RHET, in order to utilize the high-speed nature of the hot electrons 100, the collector barrier layer 5 is designed so that the energy of the electrons may be equivalent to the resonance level 8 in the state shown in FIG. 21(b). Therefore, electrons reflected by the collector barrier layer 5 are not negligible, and the current density in the ON state is not sufficiently high.

This problem will be described in more detail with reference to FIG. 22. FIG. 22 illustrates the transmissivities of an electron wave at various energies, which electron wave strikes the collector barrier layer 5 having a rectangular energy band potential profile. The transmissivities are calculated by solving the Schroedinger equation self-consistently. In the calculation, the energy of the collector barrier layer 5 is 0.4 eV. As shown in FIG. 22, the transmissivity of the electron wave begins to rise where the energy of the incident electron wave is around 0.3 eV and then Gradually increases until the incident electron wave energy becomes 0.4 eV. When the incident electron wave energy reaches 0.4 eV which is the energy of the collector barrier layer 5, the transmissivity steeply increases and, thereafter, slowly approaches 1 with an increase in the incident electron wave energy, but it never reaches 1. This is caused by reflection of the electron wave at the collector barrier layer 5 due to a quantum mechanical effect of the incident electron wave. Thereby, the transmissivity at an energy of 0.4 eV is only 30%. On the other hand, it is possible to increase the transmissivity by reducing the effective energy of the collector barrier layer 5. In this case, however, electrons which have been scattered in the base layer and have lost energy unfavorably pass through the collector barrier layer 5, whereby the RHET loses its high-speed nature. For the reasons described above, when only the hot electrons 100 are used in the transistor operation to achieve a high-speed operation, the current density in the ON state cannot be increased, so that a sufficient P/V ratio in practical use is not obtained. If the current density is increased, the RHET loses its high-speed nature.

In addition, while the prior art HBT including the wide band gap emitter achieves a high current gain as described above, if the reverse injection from the base is further reduced, a higher current gain is obtained.

SUMMARY OF THE INVENTION

An object of the present invention is to provide a RHET having a high current density in its ON state and a sufficient P/V ratio in practical use.

Another object of the present invention is to provide a RHET including a spacer layer disposed between a collector barrier layer and a collector, which has a high current density in its ON state and a sufficient P/V ratio in practical use.

A further object of the present invention is to provide a hot electron transistor (hereinafter referred to as HET) including an emitter layer serving as a source of hot electrons and a collector barrier layer disposed between a base layer and a collector layer, which has a high current density in its ON state and a sufficient P/V ratio in practical use.

Another object of the present invention is to provide a method of producing a RHET having a high current density in its ON state and a sufficient P/V ratio in practical use and a method of producing a HET having a high current density in its ON state and a sufficient P/V ratio in practical use.

Still another object of the present invention is to provide a RHET that has a high current density in its ON state, a low current density in its OFF state, and a sufficient P/V ratio in practical use, and that reduces scattering of electrons due to impurities in a collector barrier layer.

Yet another object of the present invention is to provide a HET that has a sufficient current density in its ON state in practical use and that reduces scattering of electrons due to impurities in a collector barrier layer.

A still further object of the present invention is to provide a HBT with a low reverse-injected current and a high current gain.

Other objects and advantages of the present invention will become apparent from the detailed description given hereinafter; it should be understood, however, that the detailed description and specific embodiment are given by way of illustration only since various changes and modifications within the spirit and scope of the invention will become apparent to those skilled in the art from this detailed description.

According to a first aspect of the present invention, in a high-speed semiconductor device including an emitter layer serving as an injection source of hot electrons and a collector barrier layer disposed between a base layer and a collector layer, an energy band potential profile of the collector barrier layer is gradually varied from a region in the vicinity of the boundary between the base layer and the collector barrier layer. Therefore, reflection of an electron wave at the collector barrier layer is reduced. As the result, a RHET which ensures a high current density in its ON state and a sufficient P/V ratio in its practical use is achieved. In addition, a HET which ensures a high current density in its ON state is achieved.

According to a second aspect of the present invention, in a method of producing a high-speed semiconductor device including a collector barrier layer disposed between a base layer and a collector layer, the collector barrier layer is formed so that its material composition is gradually varied from a region in the vicinity of a boundary between the base layer and the collector barrier layer. Therefore, a high-speed semiconductor device that can significantly reduce reflection of an electron wave at the collector barrier layer is produced with high controllability.

According to a third aspect of the present invention, in a high-speed semiconductor device including an emitter layer serving as an injection source of hot electrons and a collector barrier layer disposed between a base layer and a collector layer, the collector barrier layer includes a multiquantum barrier comprising at least one barrier layer for preventing tunneling and a multiquantum well layer. Therefore, a RHET which ensures a high current density in its ON state and a sufficient P/V ratio in its practical use is achieved. In addition, a HET with a high current density in its ON state is achieved.

According to a fourth aspect of the present invention, in a hetero-bipolar-junction type high-speed semiconductor device, a multiquantum barrier comprising at least one barrier layer for preventing tunneling and a multiquantum well layer is disposed in the emitter region near the base. Therefore, HBT in which a reverse injected current is significantly reduced and a high current gain is obtained is achieved.

BRIEF DESCRIPTION OF THE DRAWINGS

FIGS. 20(a) and 20(b) are a schematic cross section and an equivalent energy band diagram, respectively, illustrating the prior art RHET;

FIGS. 21(a)–21(c) are energy band diagrams for explaining an operating principle of the prior art RHET;

DETAILED DESCRIPTION OF THE PREFERRED EMBODIMENTS

Figure 1A:
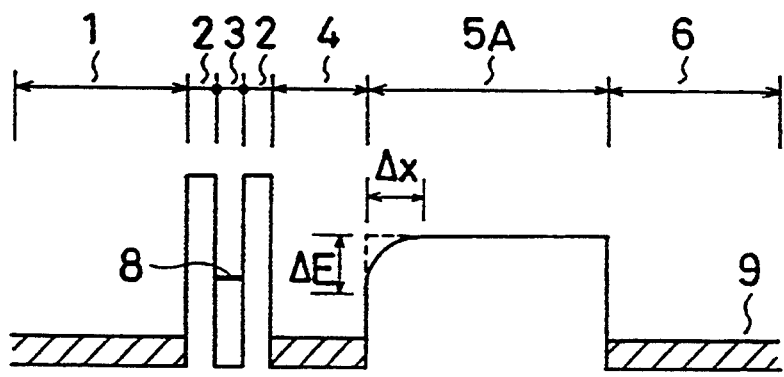
FIGS. 1(a) and 1(b) are energy band diagrams of a RHET in accordance with a first embodiment of the present invention.
Figure 1B:
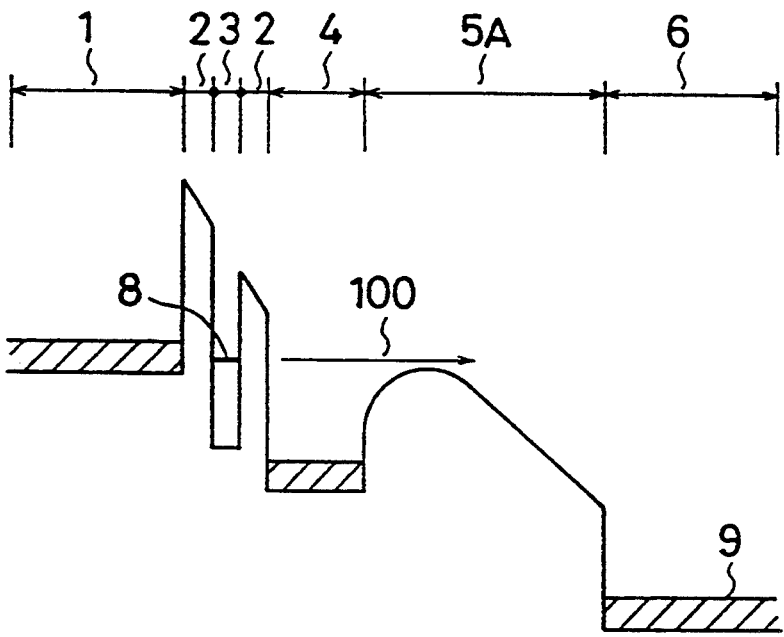

FIGS. 1(a) and 1(b) are energy band diagrams of a high-speed semiconductor device in accordance with a first embodiment of the present invention, in which FIG. 1(a) shows an energy band diagram in a state where no voltage is applied and FIG. 1(b) shows an energy band diagram in a state where a voltage is applied. In the figures, reference numeral 1 designates an n+ type GaAs emitter layer, numeral 2 designates an intrinsic $Al_xGa_{1-x}As$ potential barrier layer, numeral 3 designates an intrinsic GaAs well layer, numeral 4 designates an n type GaAs base layer, numeral 6 designates an n type GaAs collector layer, numeral 8 designates a resonance energy level, and numeral 9 designates the Fermi level. The well layer 3 is sandwiched between two potential barrier layers 2 and the resonance level 8 is formed in the well layer 3, whereby a resonant tunneling barrier on the emitter side is produced. A graded collector barrier layer 5A is disposed between the base layer 4 and the collector layer 6. Reference numeral 100 designates hot electrons. The semiconductor device employed in this first embodiment is a resonant-tunneling hot electron transistor (RHET) including a resonant tunneling barrier on the emitter side having at least one quantum well in which the resonant level 8 is formed, and the collector barrier layer 5A disposed between the base layer 4 and the collector layer 6. In this embodiment, the energy band potential profile of the collector barrier layer 5A is gradually varied from a region near the boundary between the collector barrier layer 5A and the base layer 4. Reference character $\Delta E$ designates the variation in energy in the graded portion of the collector barrier layer 5A and reference character $\Delta X$ designates the region of the variation in real space. The collector barrier layer 5A having the graded potential profile is provided to suppress reflection of the electron wave in ON state and, therefore, it must have a sufficient potential change. More specifically, the variation region $\Delta X$ in real space should have a larger value than the electron wavelength of the incident hot electron 100, and the variation in energy $\Delta E$ should be larger than the amplitude of the energy of the incident hot electron 100. In this first embodiment, since the electron wavelength and amplitude of the hot electron 100 are about 6 nm and 0.03 eV, respectively, $\Delta X$ and $\Delta E$ are set to 20 nm and 0.1 eV, respectively. Although the graded portion of the potential profile shown in FIG. 1(a) is in a shape of a circular arc, it may be in any shape so long as the potential profile changes smoothly.

A description is given of an electron wave reflection reducing effect of the collector barrier layer 5A having the graded potential profile.

Figure 2:
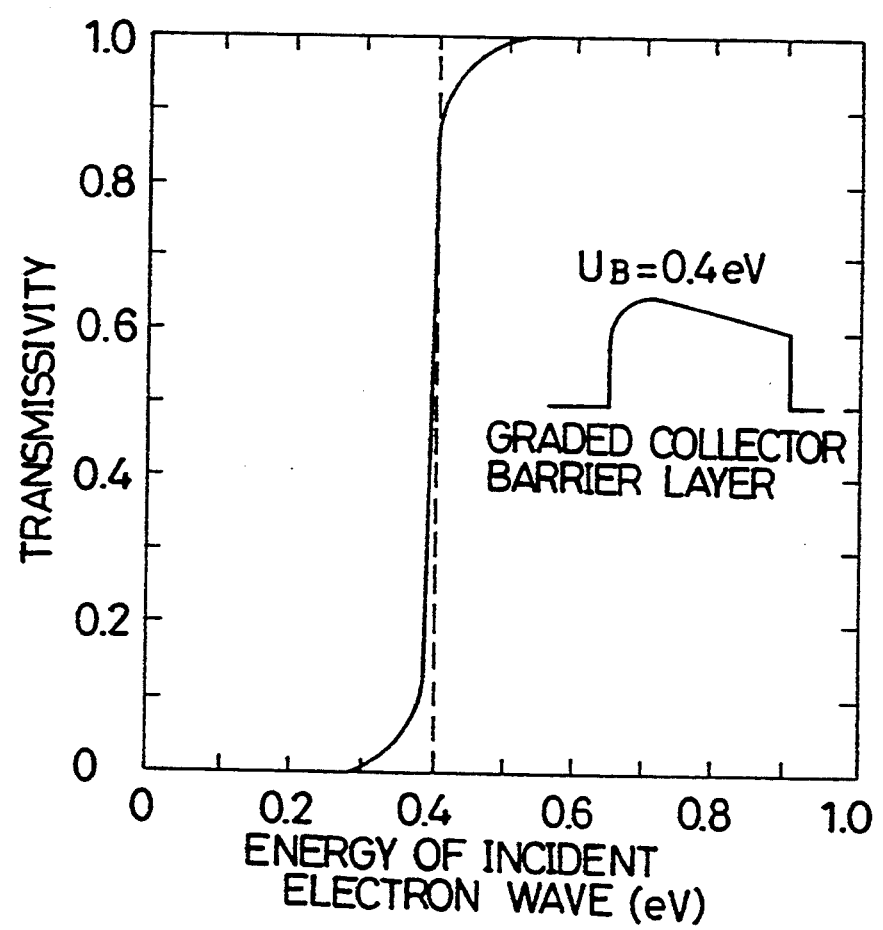
FIG. 2 is a diagram illustrating transmissivities of an electron wave at various energies, which electron wave strikes a collector barrier layer having a graded potential profile.
Figure 22:
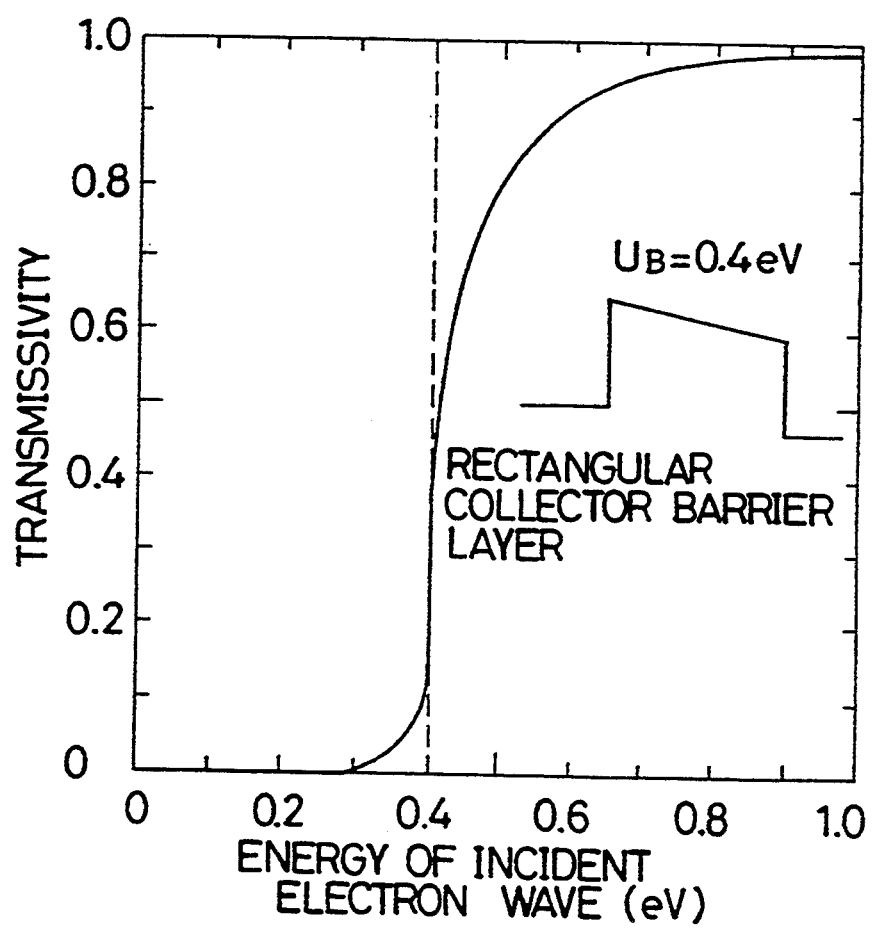
FIG. 22 is a diagram illustrating transmissivities of an electron wave at various energies in accordance with the prior art.

FIG. 2 illustrates transmissivities of an electron wave at various energies, which an electron wave strikes the collector barrier layer 5A with the graded potential profile. The transmissivities are obtained by selfconsistently solving the Schroediner equation. In the calculation, the energy of the collector barrier layer 5A is 0.4 eV. The transmissivity of the electron wave suddenly rises when the energy of the incident electron wave exceeds 0.3 eV, and it reaches 90% at the energy of 0.4 eV. In case of the conventional RHET with the collector barrier layer having the rectangle potential profile, the transmissivity at the energy of 0.4 eV is only 30% as shown in FIG. 22. On the other hand, in the RHET with the collector barrier layer 5A having the graded potential profile, the transmissivity of electrons in the ON state is significantly increased.

Figure 3:
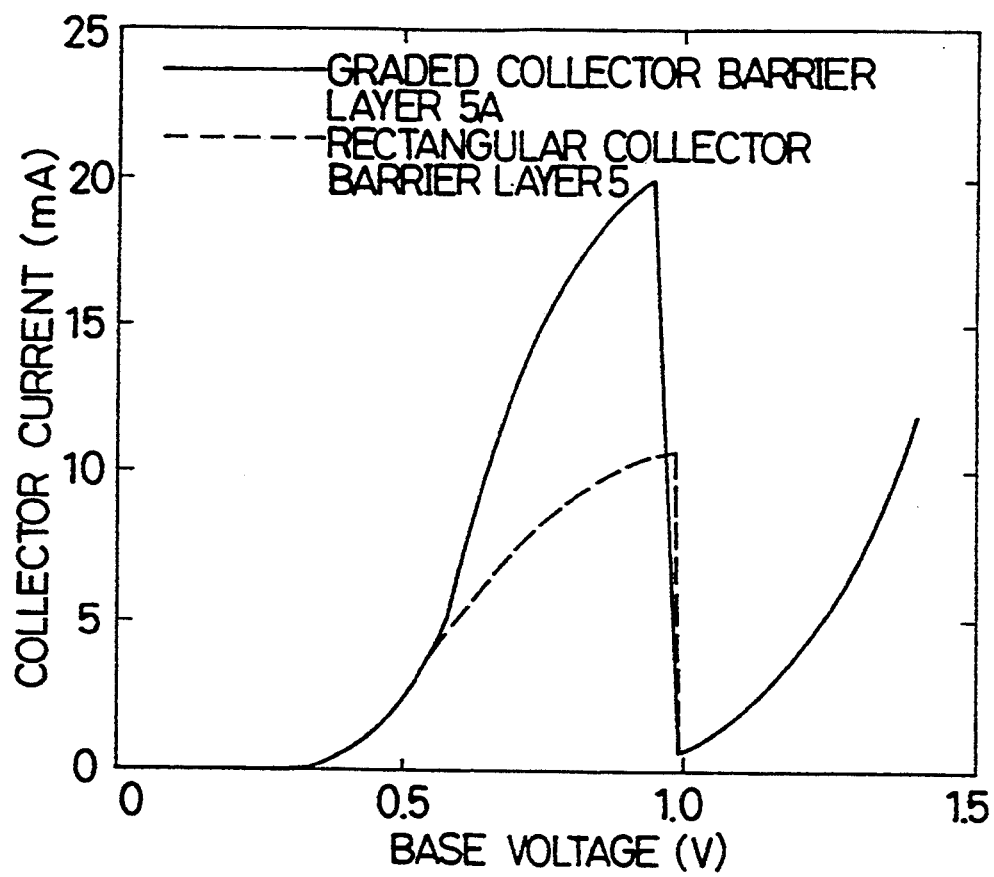
FIG. 3 is a diagram illustrating current vs. voltage characteristics of the RHET according to the first embodiment of the present invention and the RHET according to the prior art.

FIG. 3 illustrates current vs. voltage characteristics of RHETs, in which a solid line shows I–V characteristics of the RHET with the collector barrier layer 5A having the graded potential profile in accordance with the first embodiment of the present invention and a dashed line shows I–V characteristics of the conventional RHET with the collector barrier layer 5 having the rectangle potential profile. These I–V characteristics are measured at liquid nitrogen temperature, i.e., 77 K. As shown in FIG. 3, in the RHET of this embodiment, reflection of the electron wave is significantly reduced due to the presence of the collector barrier layer 5A with the graded potential profile, whereby a peak current twice as large as the peak current of the conventional RHET is obtained. In addition, P/V ratio, i.e., a ratio of the current density in ON state to the current density in OFF state, is as high as 20.

Figure 4:
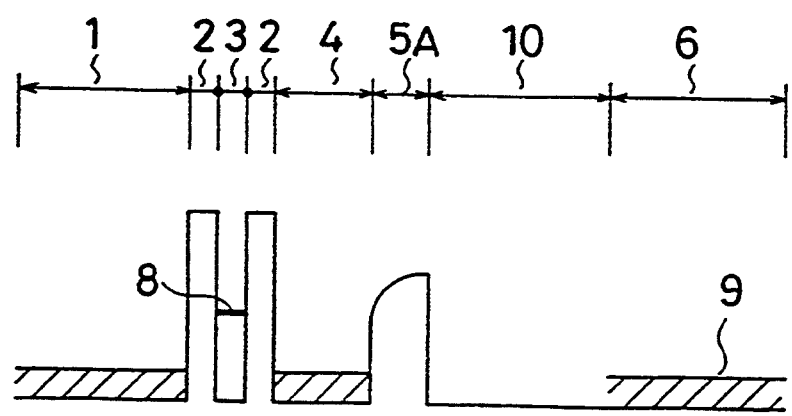
FIG. 4 is an energy band diagram of a RHET in accordance with a second embodiment of the present invention.

FIG. 4 is an energy band diagram in a cross section of a RHET in accordance with a second embodiment of the present invention. In FIG. 4, reference numeral 10 designates an intrinsic GaAs spacer layer. Other structures are the same as those in FIG. 1(a) and 1(b).

When the collector barrier layer is thick, electrons which have been scattered in the collector barrier layer and have lost energy sometimes cause static charging. In order to avoid this problem, a RHET including a thin collector barrier layer 5A and a spacer layer 10 for insulating the collector barrier layer 5A from the collector layer 6 has been proposed. In this second embodiment, the potential profile of the collector barrier layer 5A of this type RHET is gradually varied, resulting in a high P/V ratio.

Figure 5:
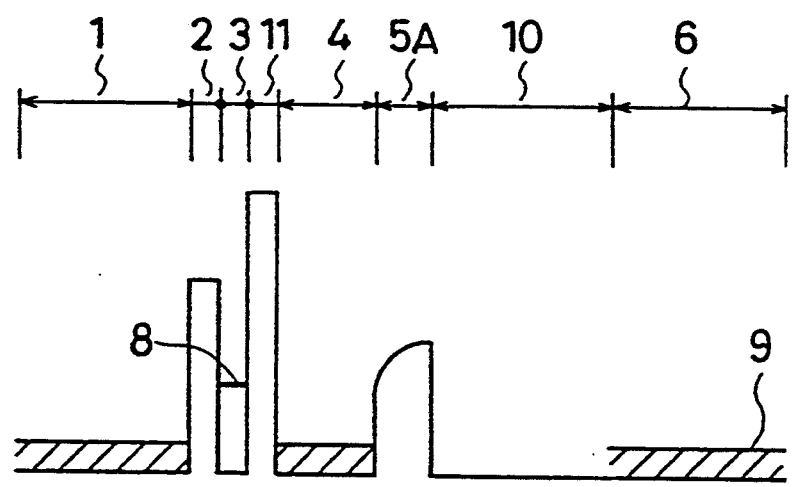
FIG. 5 is an energy band diagram of a RHET in accordance with a third embodiment of the present invention.

FIG. 5 is an energy band diagram of a RHET in accordance with a third embodiment of the present invention. In FIG. 5, reference numeral 11 designates an intrinsic $Al_zGa_{1-z}As$ ($z>x$) potential barrier layer. Other elements are the same as those in FIG. 4. In the RHET of FIG. 4, electrons are injected from the emitter into the base not through the resonant tunneling barrier but over the potential barrier layer 2. In the RHET of FIG. 5, however, since the energy band gap of the potential barrier layer 11 is increased, no electron is injected into the base over the potential barrier layer 11, whereby only hot electrons injected through the resonant tunneling are used for the operation of the transistor. In this third embodiment, the potential profile of the collector barrier layer of the RHET shown in FIG. 5 is gradually varied, whereby a high P/V ratio is achieved.

Figure 6:
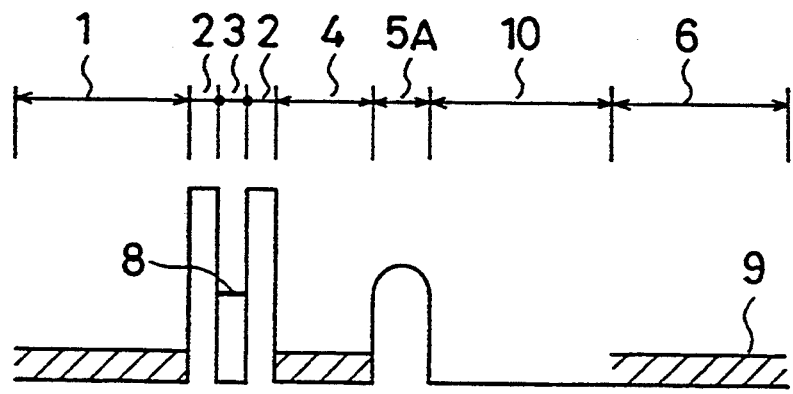
FIG. 6 is an energy band diagram of a RHET in accordance with a fourth embodiment of the present invention.

FIG. 6 is an energy band diagram of a RHET in accordance with a fourth embodiment of the present invention. In this fourth embodiment, the same RHET as in the second embodiment is employed and the potential profile of the collector barrier layer 5A on the collector side is also gradually varied. Also in this structure, a high P/V ratio is obtained.

Figure 7:
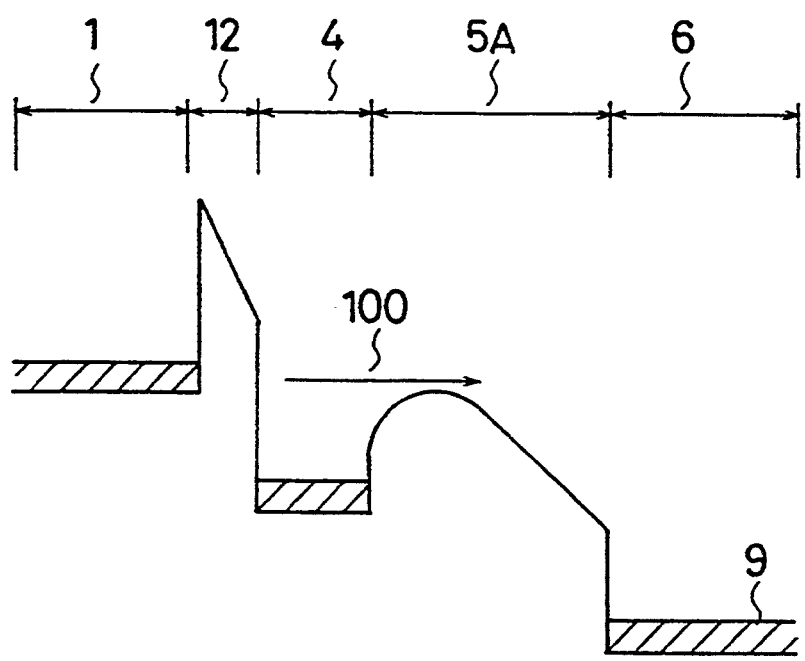
FIG. 7 is an energy band diagram of a HET in accordance with a fifth embodiment of the present invention.

FIG. 7 is an energy band diagram of a high-speed semiconductor device in accordance with a fifth embodiment of the present invention. In FIG. 7, reference numeral 1 designates an n+ type GaAs emitter layer, numeral 4 designates an n type GaAs base layer, numeral 5A designates a collector barrier layer having a graded potential profile, numeral 6 designates an n type GaAs collector layer, numeral 9 designates the Fermi level, and numeral 12 designates an AlGaAs tunneling barrier layer.

The high-speed semiconductor device employed in this fifth embodiment is a hot electron transistor (HET) utilizing electrons which have passed through a tunneling barrier or a heterobarrier, i.e., hot electrons 100, for the operation of the transistor. In this fifth embodiment, the potential profile of the collector barrier layer 5A of the HET is gradually varied. Therefore, in the ON state of the HET, reflection of electrons at the collector barrier layer is suppressed in the same manner as described in the first to fourth embodiments, whereby a high current density is obtained.

Figure 8A:
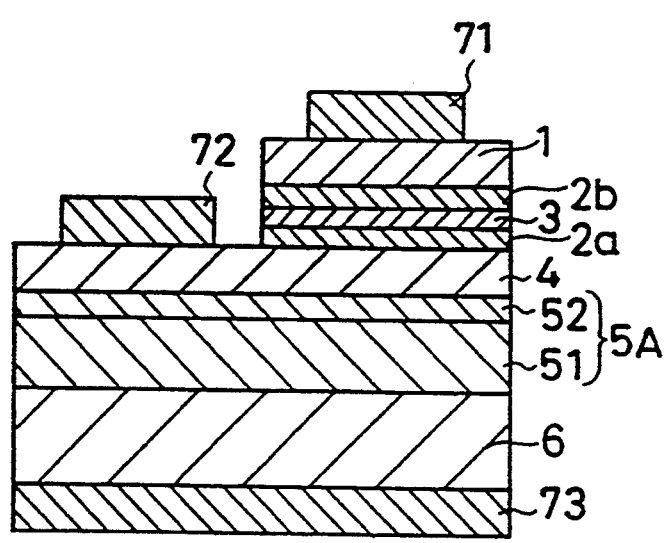
FIGS. 8(a) and 8(b) are schematic diagrams for explaining a method of producing a high-speed semiconductor device in accordance with a sixth embodiment of the present invention.
Figure 8B:
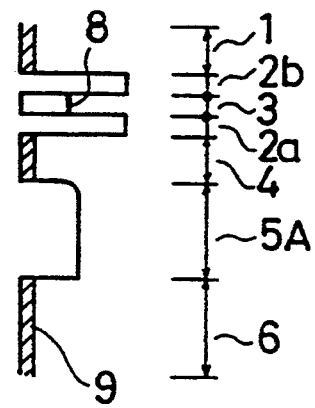

A description is given of a method of producing the collector barrier layer 5A having the graded energy band potential profile, in accordance with a sixth embodiment of the present invention. FIGS. 8(a) and 8(b) are a schematic cross section of the RHET of the first embodiment and an equivalent energy band diagram thereof, respectively.

The intrinsic $Al_yGa_{1-y}As$ collector barrier layer 5A having the graded potential profile is produced with high reproducibility by gradually varying the Al composition y in a layer 52 near the boundary between the collector barrier layer 5A and the n type GaAs base layer 4. For example, when the intrinsic $Al_yGa_{1-y}As$ layer 5A is grown on the n type GaAs layer 6 by metal organic chemical vapor deposition (MOCVD), a layer 51 with a flat potential profile is grown first with a constant Al composition y=0.3, and then the layer 52 is grown on the $Al_yGa_{1-y}As$ layer 51 with a constant Al composition while gradually varying the Al composition y from 0.3 to 0.22. Thereby, a potential change of about 0.1 eV is obtained in the $Al_yGa_{1-y}As$ layer 52 in the vicinity of the boundary between the collector barrier layer 5A and the base layer 4. Thereafter, the n type GaAs base layer 4, the intrinsic $Al_xGa_{1-x}As$ lower potential barrier layer 2a, the intrinsic GaAs well layer 3, the intrinsic $Al_xGa_{1-x}As$ upper potential barrier layer 2b, and the n+ type GaAs emitter layer 1 are successively grown on the $Al_yGa_{1-y}As$ layer 52, resulting in the structure shown in FIG. 8(a). As shown in FIG. 8(b), the potential profile in the $Al_yGa_{1-y}As$ layer 52 is graded.

The smooth potential profile with no step like that shown in FIG. 8(b) is obtained by continuously carrying out the growth white gradually varying the supply ratio of source gases. However, the growth may be carried out intermittently with different ratios of the source gases. In this case, the potential varies in rarron tiers.

While in the sixth embodiment MOCVD is employed for the growth of the collector barrier layer 5A having the graded potential profile, other growth methods capable of controlling the composition at an atomic layer level, for example, atomic layer epitaxy (ALE), molecular beam epitaxy (MBE), and the like may be employed with the same effects as described above.

Figure 9A:
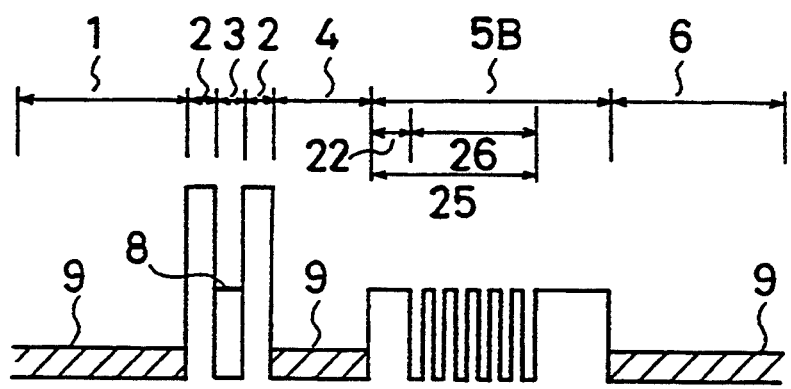
FIGS. 9(a) and 9(b) are energy band diagrams of a RHET in accordance with a seventh embodiment of the present invention.
Figure 9B:
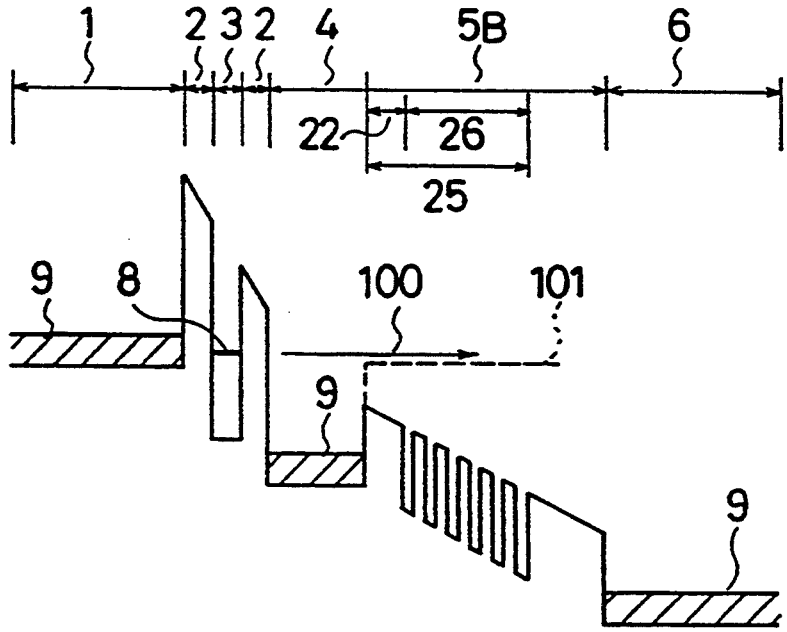
Figure 11A:
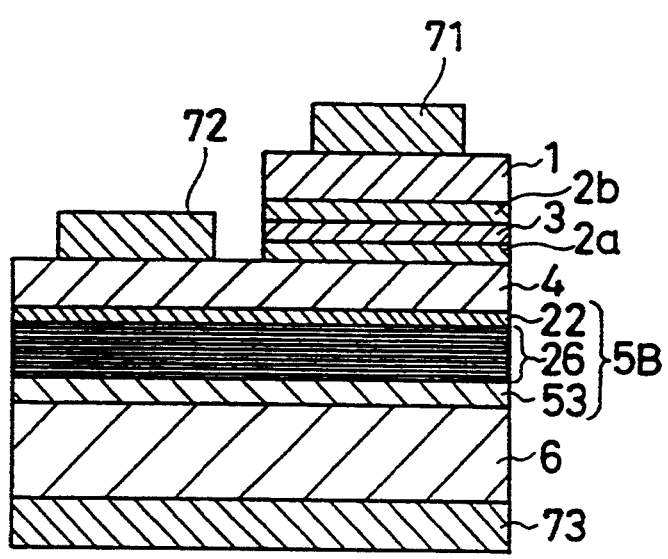
FIGS. 11(a) and 11(b) are a schematic cross section and an equivalent energy band diagram of the RHET in accordance with the seventh embodiment of the present invention.
Figure 11B:
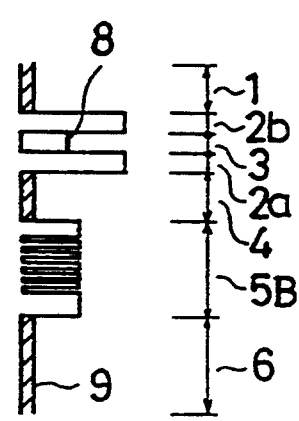

FIGS. 9(a) and 9(b) illustrate energy band diagrams in a cross section of a high-speed semiconductor device in accordance with a seventh embodiment of the present invention, in which FIG. 9(a) shows an energy band diagram in a state where no voltage is applied and FIG. 9(b) shows an energy band diagram in a state where a voltage is applied. FIG. 11(a) is a schematic cross section of the high-speed semiconductor device according to the seventh embodiment and FIG. 11(b) is an equivalent energy band diagram thereof. In the figures, a collector barrier layer 5B including a multiquantum barrier (hereinafter referred to as MQB) 25 and spacer layer 53 is disposed on an n type GaAs collector layer 6. An n type GaAs base layer 4 is disposed on the collector barrier layer 5B. A lower intrinsic $Al_xGa_{1-x}As$ potential barrier layer 2a, an intrinsic GaAs well layer 3, an upper intrinsic $Al_xGa_{1-x}As$ potential barrier layer 2b, and an n+ type GaAs emitter layer 1 are successively disposed on the GaAs base layer 4. Reference numerals 8 and 9 designate a resonance level and the Fermi level, respectively. The well layer 3 is sandwiched by the two potential barrier layers 2a and 2b and the resonance level 8 is formed in the well layer 3, whereby a resonant tunneling barrier on the emitter side is produced. The MQB 25 comprises a tunnel-preventing potential barrier layer 22 and a multiquantum well 26. Reference numeral 100 designates hot electrons, and reference numeral 101 designates an effective potential barrier formed in the collector barrier layer due to the MQB 25.

The high-speed semiconductor device employed in this embodiment is a resonant-tunneling hot electron transistor including an emitter side resonant tunneling barrier having at least one quantum well in which a resonance energy level is formed, and a collector barrier layer disposed between a base layer and a collector layer. In this seventh embodiment, the collector barrier layer 5B comprises the tunnel-preventing barrier layer 22 and the multiquantum well 26. Since the potential structure comprising the tunnel-preventing barrier layer 22 and the multiquantum well 26 serves as a layer for reflecting carriers, it is called a multiquantum barrier (MQB).

Figure 10:
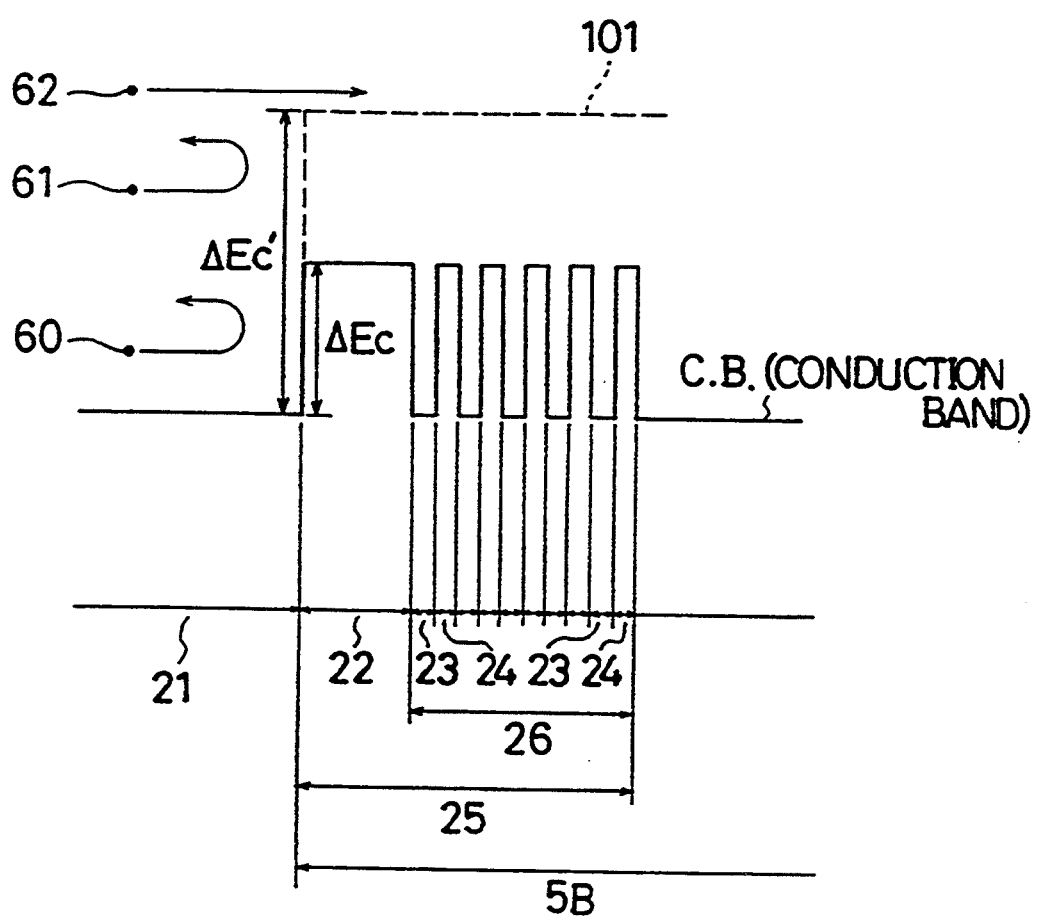
FIG. 10 is a schematic diagram for explaining a function of a multiquantum barrier (MQB)

Functions of the MQB structure will be described with reference to FIG. 10. FIG. 10 illustrates the conduction band edge of the MQB structure. In FIG. 10, reference numeral 21 designates a GaAs layer, numeral 22 designates a tunnel-preventing AlGaAs barrier layer, numeral 23 designates a GaAs quantum well layer, numeral 24 designates an AlGaAs barrier layer, numeral 25 designates an MQB structure, numeral 26 designates a multiquantum well, and numeral 101 designates an effective potential barrier. In addition, reference numerals 60, 61, and 62 designate electrons. Reference character $\Delta Ec$ designates a difference in energies between the conduction band of GaAs and the conduction band of AlGaAs, and character $\Delta Ec'$ designates an effective potential barrier height.

This MQB functions as a reflecting layer for electrons incident on the MQB from the GaAs layer 21 side. In a case where only the superlattice structure 26 is present, since a mini-band is formed in the well, electrons with energies below $\Delta Ec$ are transmitted. In FIG. 10, however, since the tunnel-preventing potential barrier layer 22 is present between the superlattice structure 26 and the GaAs layer 21, electrons 60 with energies below $\Delta Ec$ are not transmitted. In addition, electrons 61 with energies higher than $\Delta Ec$ are reflected due to the effect of multiple reflections of the superlattice 26. In this way, the reflection of electrons is controlled by combining the tunnel-preventing barrier layer 22 and the multi quantum well 26 and by controlling structures thereof.

The MQB has a characteristic capable of steeply changing the transmissivity of electrons from 0 to 1 at a certain energy of the electrons, in addition to the above-described characteristic of reflecting electrons having energies higher than the potential barrier height $\Delta Ec$.

Figure 12:
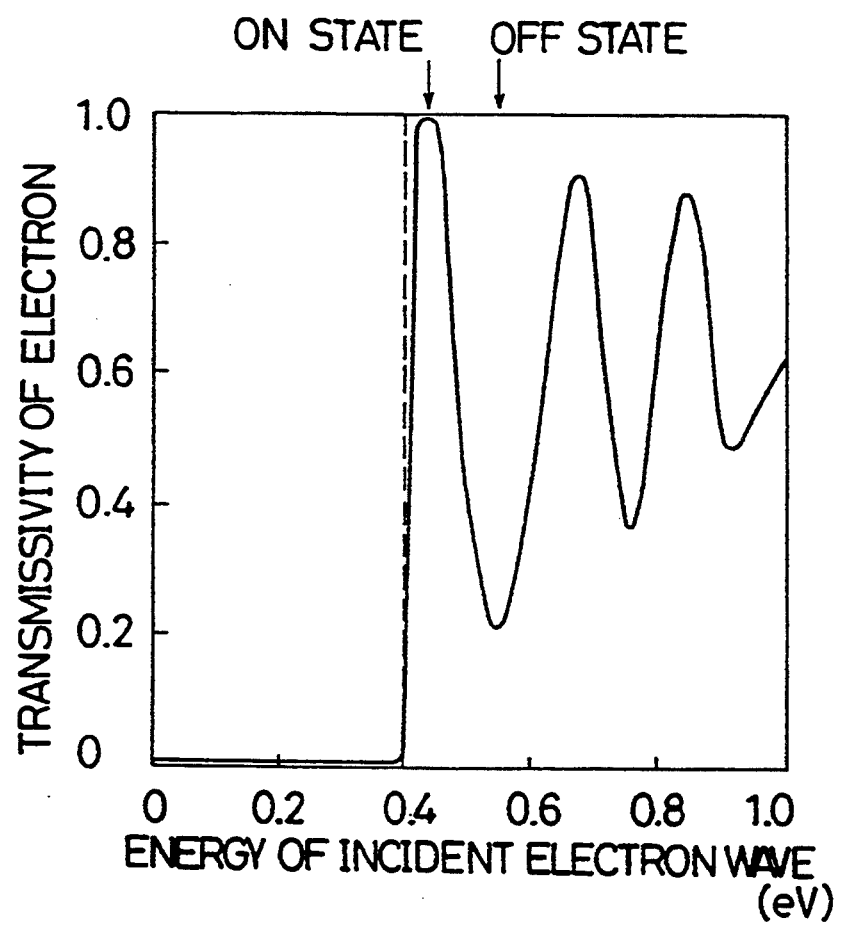
FIG. 12 is a diagram illustrating transmissivities of an electron wave at various energies, which electron wave strikes a collector barrier layer including a MQB structure.

FIG. 12 calculated transmissivities of electrons at various energies at a collector barrier layer including the MQB structure. As shown in FIG. 12, the transmissivity suddenly changes from 0 to 1 when the energy of the incident electrons exceeds 0.4 eV.

Figure 13:
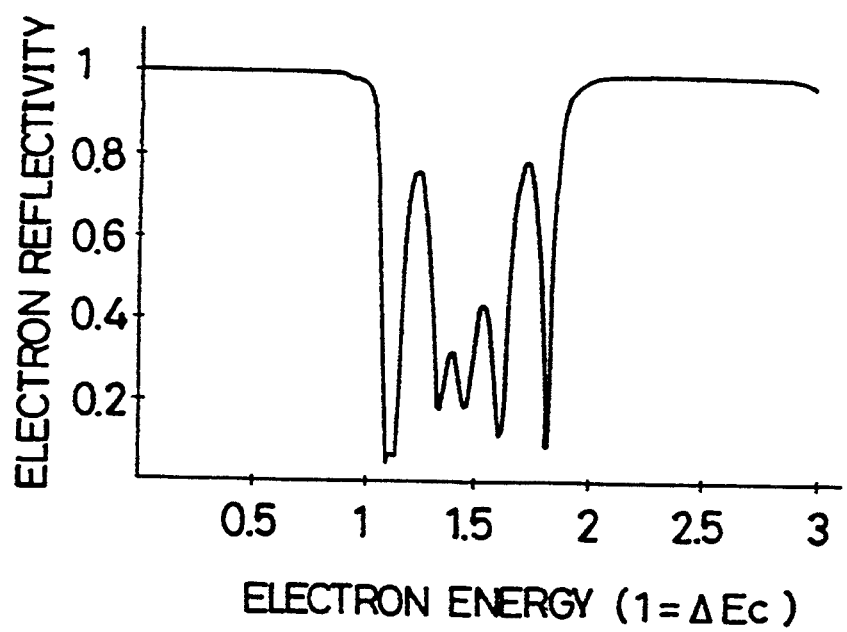
FIG. 13 is a diagram illustrating reflectivities of electrons at various energies, which electrons strike the collector barrier layer including the MQB structure.
Figure 14:
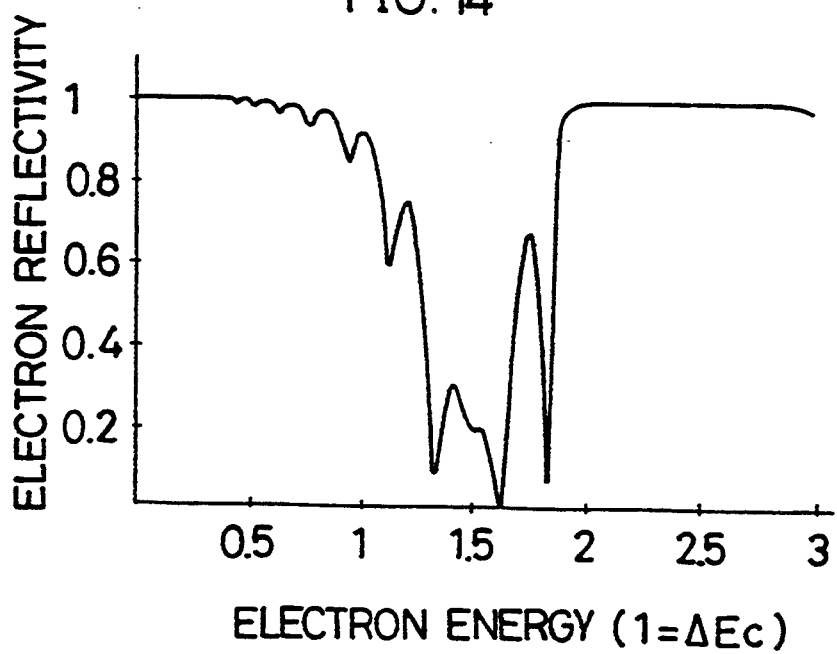
FIG. 14 is a diagram illustrating reflectivities of electrons at various energies, which electrons strike a collector barrier layer including another MQB structure.

FIG. 13 illustrates reflectivities of electrons at various energies from the AlGaAs/GaAs MQB structure. In the MQB structure, the Al composition is 0.4, thicknesses of the tunnel-preventing barrier layer 22, the GaAs quantum well layer 23, and the AlGaAs barrier layer 24 are equivalent to thicknesses of forty atomic layers, six atomic layers, and four atomic layers, respectively, and the number of the quantum wells is ten. FIG. 14 illustrates reflectivities of electrons at various energies from an MQB structure in which the thickness of the tunnel-preventing barrier layer 22 is equivalent to the thickness of twenty atomic layers and other conditions are the same as described above. The reflectivities are calculated quantum-mechanically under an assumption that the coherent length of electrons is infinite and there is no scattering of electrons in the crystal.

In FIG. 13, the reflectivity suddenly falls from 1 to below 0.1 when the electron energy exceeds 1 eV, i.e., the band discontinuity $\Delta Ec$ in the conduction band. Thereafter, oscillations in the electron reflectivity caused by the multiple reflections appear until the electron energy reaches about 1.8 eV. On the other hand, since the thickness of the tunnel-preventing barrier layer 22 is decreased to twenty atomic layers in FIG. 14, a sufficient tunnel-preventing effect is not obtained and electrons with energies below $\Delta Ec$ are unfavorably transmitted, so that it is impossible to steeply change the transmissivity at a particular energy value. Therefore, in order to realize the steep change in transmissivity, the tunnel-preventing barrier layer included in the AlGaAs/GaAs MQB must be thicker than forty atomic layers.

When the MQB structure is included in a collector barrier layer of an RHET, the transmissivity of incident electron wave suddenly rises at about 0.4 eV and reaches approximately 100% as shown in FIG. 12. In the conventional RHET including the collector barrier layer with the rectangular potential profile, the transmissivity at 0.4 eV is only 30% as shown in FIG. 22. This means that the transmissivity of electrons in the ON state is significantly improved by adopting the MQB structure in the collector barrier layer.

In the collector barrier layer including the MQB structure, as shown in FIG. 12, the transmissivity of electrons suddenly falls when the energy of the incident electron wave exceeds 0.4 eV and, thereafter, it alternatingly rises and falls. As an effective potential barrier due to the MQB structure, a continuous barrier is formed until the electron energy reaches 0.4 eV, and discrete barriers are formed at electron energies higher than 0.4 eV, by controlling the MQB structure. Each of the discrete barriers is caused by a mini-band formed in the well of the superlattice structure 26 constituting the MQB structure, and the above-described periodicity in the electron transmissivity is caused by the discrete barriers. Accordingly, in a RHET provided with a collector barrier layer having the MQB structure, the OFF state can be adjusted to an energy at which the electron transmissivity is low, whereby the current value in the OFF state is reduced.

Furthermore, in this seventh embodiment, since the effective barrier height is increased by the MQB structure, the Al composition in the AlGaAs collector barrier layer is relatively decreased. In AlGaAs, scattering of electrons increases with an increase in the Al composition. In this embodiment, however, since the Al composition in the AlGaAs collector barrier layer can be decreased as described above, the scattering of electrons in the collector barrier layer is reduced, resulting in a low-noise and high-speed RHET.

Figure 15:
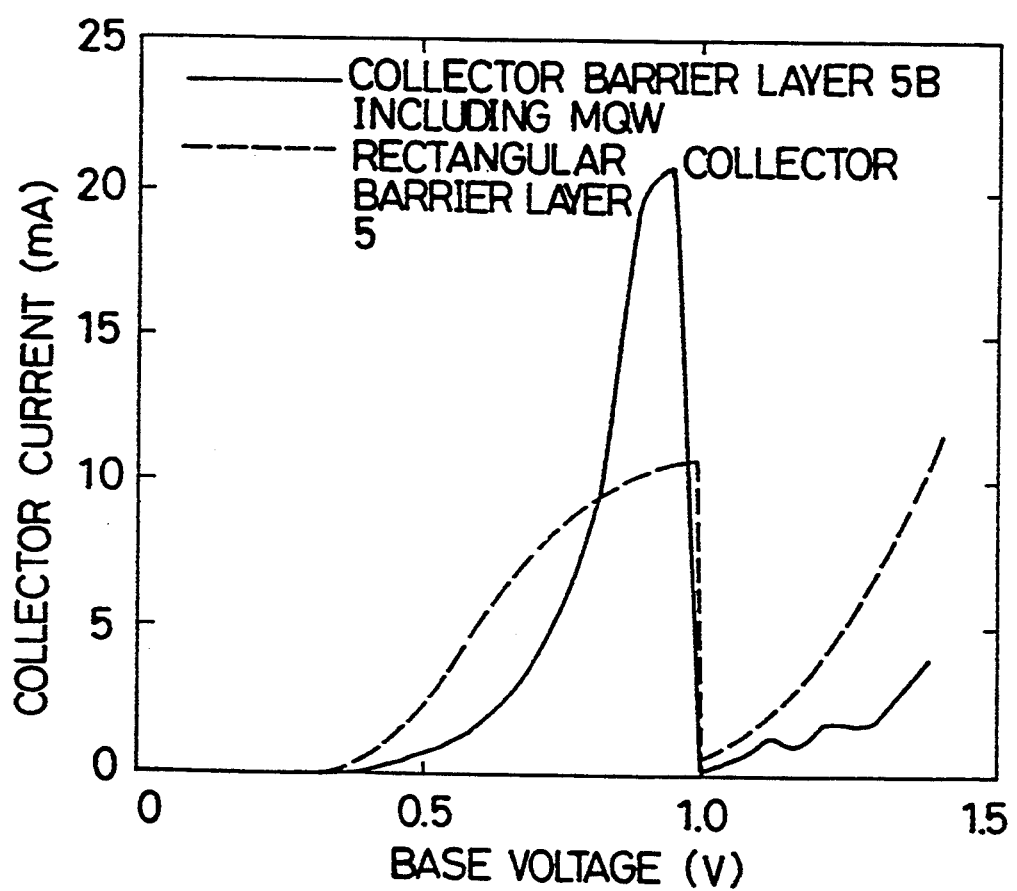
FIG. 15 is a diagram illustrating current vs. voltage characteristics of the RHET according to the seventh embodiment of the present invention and the RHET according to the prior art.

FIG. 15 illustrates I-V characteristics of RHETs, in which the solid line shows I-V characteristics of the RHET including the collector barrier layer 5B having the MQB structure and a broken line shows I-V characteristics of the conventional RHET including the rectangular collector barrier layer 5. These I-V characteristics are measured at liquid nitrogen temperature, i.e., 77° K. As shown in FIG. 15, in the RHET of this embodiment, a peak current about twice as high as the peak current of the conventional RHET is achieved because the reflection of the electron wave in the collector barrier layer 5A is significantly reduced. In addition, the ratio of the current density in the ON state to the current density in the OFF state, i.e., the P/V ratio is as high as 20.

Figure 16:
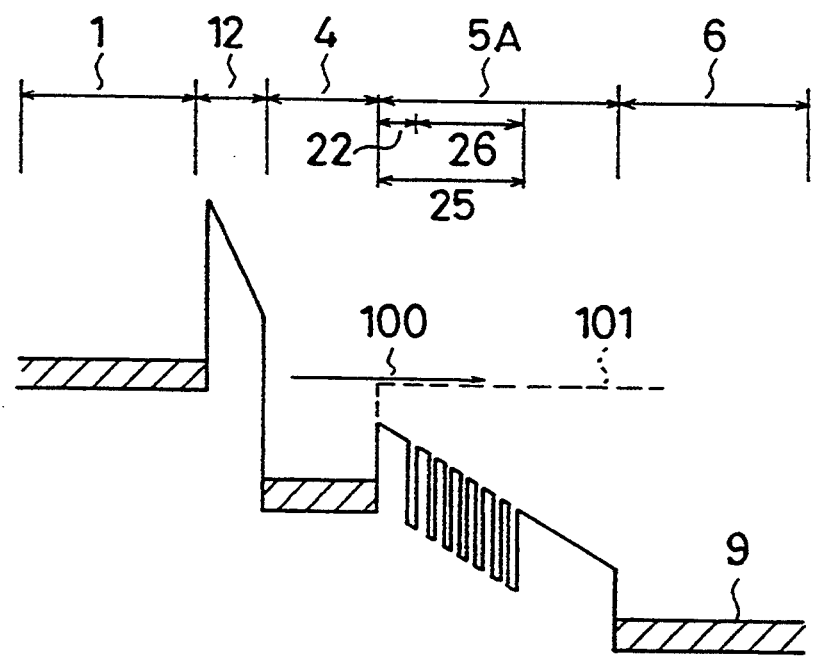
FIG. 16 is an energy band diagram of a HET accordance with an eighth embodiment of the present invention.

FIG. 16 illustrates an energy band diagram of a high-speed semiconductor device in accordance with an eighth embodiment of the present invention. In FIG. 16, reference numeral 1 designates an n+ type GaAs emitter layer, numeral 4 designates an n type GaAs base layer, numeral 5A designates a collector barrier layer having a graded potential profile, numeral 6 designates an n type GaAs collector layer, numeral 9 designates the Fermi level, and numeral 12 designates an AlGaAs tunneling barrier layer.

In this eighth embodiment, the MQB structure 25 is included in a collector barrier layer of a HET in which only hot electrons, i.e., electrons transmitted through a barrier layer or a heterobarrier, are used for the operation of the transistor. In this eighth embodiment, during the ON state of the HET, reflection of electrons at the collector barrier layer is suppressed in the same manner as described in the seventh embodiment, whereby a high current density is obtained.

While in the above-described seventh and eighth embodiments of the present invention GaAs and AlGaAs are used as materials of the high-speed semiconductor device, the present invention may be applied to other high-speed semiconductor devices comprising other semiconductor materials.

Figure 17A:
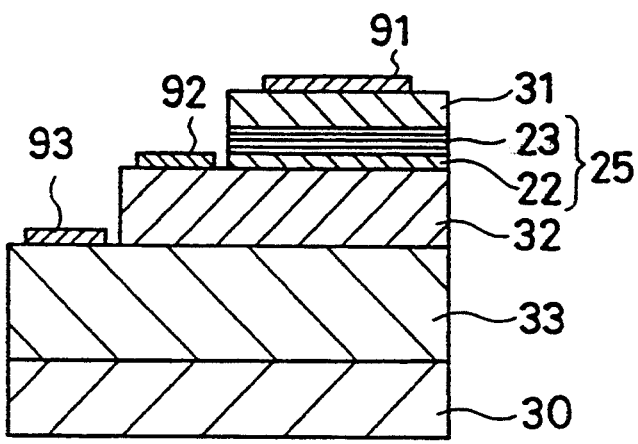
FIGS. 17(a) and 17(b) are schematic diagrams illustrating a HBT in accordance with a ninth embodiment of the present invention.
Figure 17B:
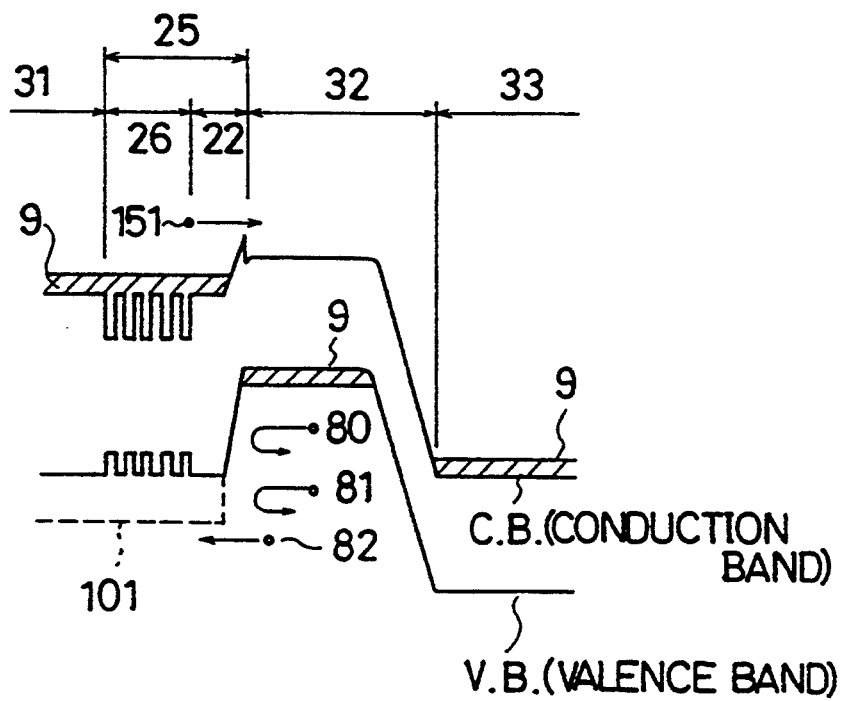

FIGS. 17(a) and 17(b) are diagrams illustrating a high-speed semiconductor device in accordance with a ninth embodiment of the present invention, in which FIG. 17(a) is a schematic cross section thereof and FIG. 17(b) is an energy band diagram thereof. In the figures, an n type GaAs collector layer 33 is disposed on a GaAs substrate 30. A p type GaAs base layer 32 is disposed on the collector layer 33. An MQB structure 25 comprising a tunnel-preventing barrier layer 22 and a multiquantum well 23 is disposed on the base layer 32, and an n type AlGaAs emitter layer 31 is disposed on the MQB structure 25. Reference numerals 91, 92, and 93 designate an emitter electrode, a base electrode, and a collector electrode, respectively. Reference numerals 80, 81, and 82 designate holes, numeral 151 designates electrons, and numeral 9 designates a Fermi level. An effective potential barrier 101 against holes is formed in the emitter region by the MQB structure 25.

In this ninth embodiment, the MQB structure 25 is included in the emitter region of a heterojunction bipolar transistor (HBT) having an emitter-base heterojunction and a wide band gap emitter structure.

Figure 18A:
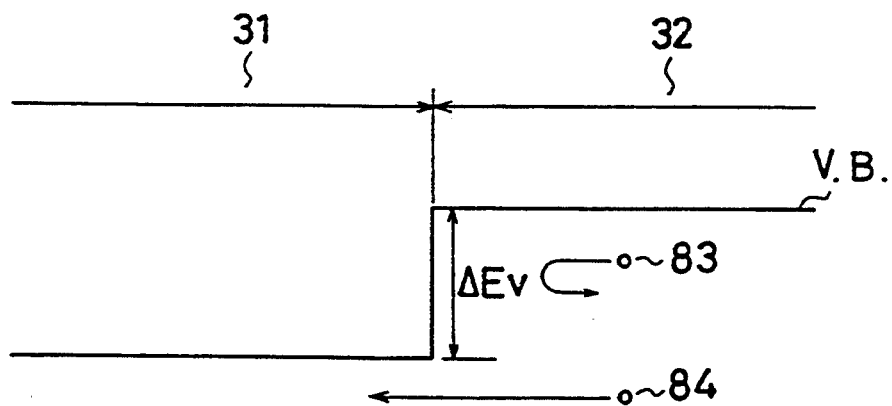
FIGS. 18(a) and 18(b) are schematic diagrams illustrating potentials of a heterojunction with an MQB structure and a heterojunction with no MQB structure, respectively, with respect to the valence band.
Figure 18B:
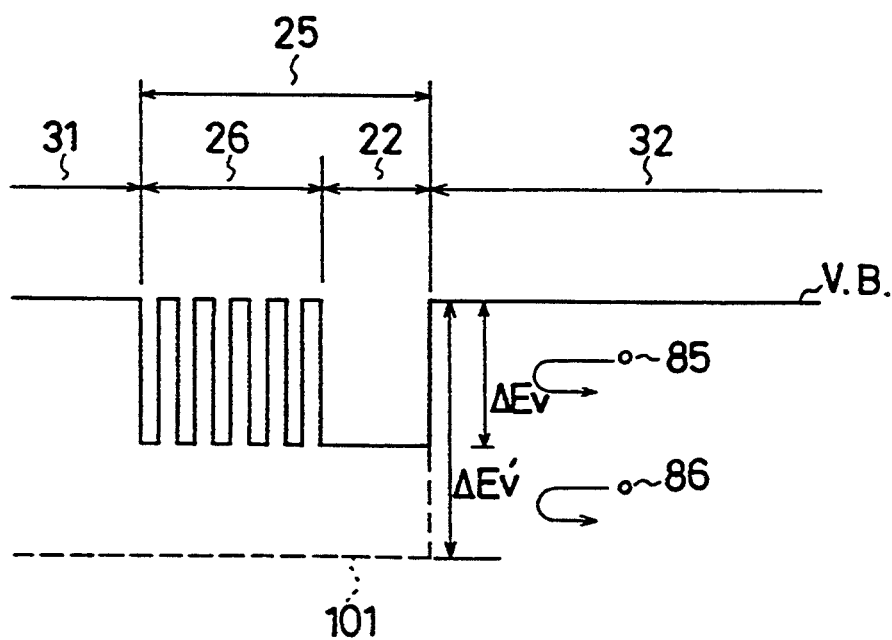

FIGS. 18(a) and 18(b) illustrate a potential diagram of a heterojunction with no MQB structure and a potential diagram of a heterojunction with an MQB structure, respectively, at the valence band edge. In the figures, the same reference numerals as in FIG. 17 designate the same or corresponding parts, and numerals 83, 84, 85, and 86 designate holes.

At the heterojunction shown in FIG. 18(a), i.e., at the boundary between the base and the emitter of the conventional HBT, the hole 83 having a kinetic energy smaller than $\Delta Ev$, which is headed for the boundary from the base side, is reflected by the potential barrier caused by the band discontinuity $\Delta Ev$ of the valence band, so that a reverse injection of the hole 83 into the emitter is avoided. However, the hole 84 having a kinetic energy larger than $\Delta Ev$ is injected into the AlGaAs emitter layer 31.

On the other hand, according to the ninth embodiment of the present invention, the MQB structure 25 is provided at the heterojunction of the HBT. More specifically, as illustrated in FIG. 18(b), the MQB structure comprising the tunnel-preventing barrier layer 22 and the multiquantum well layer 26 is disposed between the p type GaAs base layer 32 and the n type AlGaAs emitter layer 31. In this structure, the hole 85 is reflected by the potential barrier caused by the band discontinuity $\Delta Ev$ of the valence band, and the hole 86 having an energy larger than $\Delta Ev$ is also reflected by the potential barrier $\Delta Ev'$ larger than the band discontinuity $\Delta Ev$ of the valence band, whereby the reverse injection of holes into the emitter is reduced.

Figure 19:
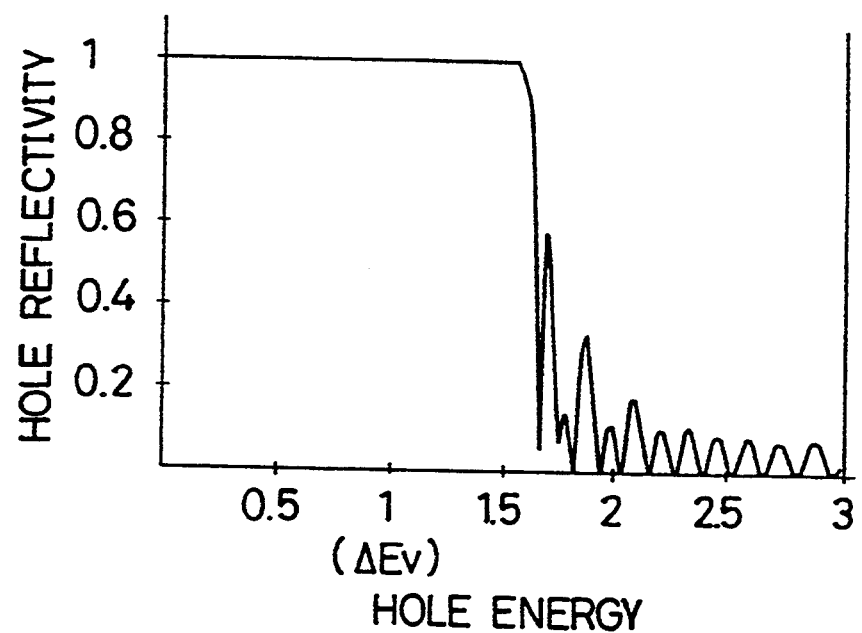
FIG. 19 is a diagram illustrating reflectivities of holes at various energies, which holes strike the heterojunction with the MQB structure.

FIG. 19 illustrates calculate reflectivities of holes at various energies at a heterojunction having the MQB structure 25 shown in FIG. 18(b). In FIG. 19, the hole energy 1 eV is equal to the band discontinuity $\Delta Ev$ in the valence band. The MQB structure comprises GaAs and $Al_{0.3}Ga_{0.7}As$. The tunnel-preventing barrier layer 22 is as thick as eighty atomic layers, the multiquantum well 26 is as thick as four atomic layers, and the AlGaAs barrier layer is as thick as six atomic layers. In addition, the number of wells is ten. As shown in FIG. 19, the effective barrier height $\Delta Ev'$ against holes is about 1.7 times as high as $\Delta Ev$. The effective barrier height $\Delta Ev'$ can easily be twice as high as $\Delta Ev$ by further optimizing the MQB structure.

Figure 23A:
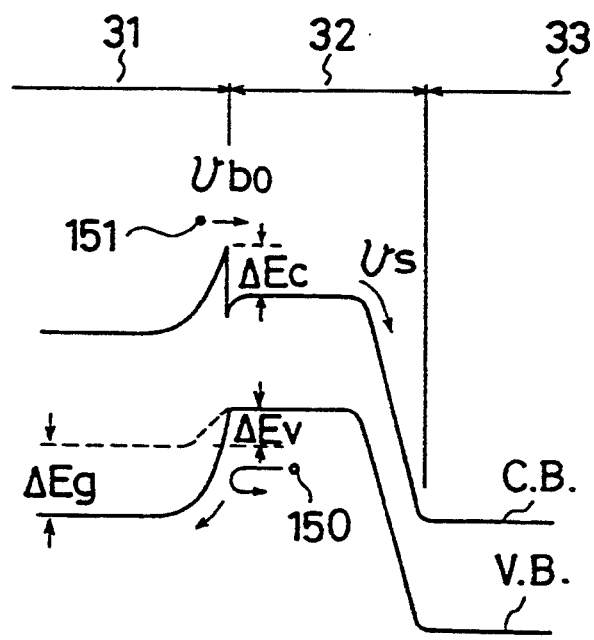
FIGS. 23(a) and 23(b) are an energy band diagram and a schematic cross section, respectively, illustrating the prior art HBT.
Figure 23B:
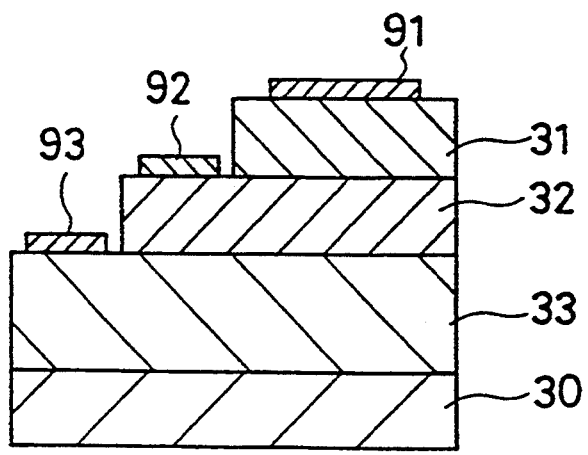

A description is given of the operation of the HBT according to the ninth embodiment with reference to FIGS. 17(a) and 17(b). The fundamental operation is similar to the operation of the conventional HBT described with respect to FIGS. 23(a) and 23(b). However, in this ninth embodiment, since the MQB structure is included in the emitter layer, the reverse injection of holes from the base to the emitter is significantly reduced. In this structure, although a potential well is produced in the conduction band in the emitter layer, since the emitter is highly doped n type, the potential well does not adversely affect the injection of electrons from the emitter to the base.

In view of device characteristics, the current amplification factor $\beta$ is represented by $$\beta = \frac{In \text{ (drift diffusion current)}}{Ip \text{ (reverse injected hole current)}}$$

where recombination is ignored. In addition, the reverse injected hole current Ip is represented by $$Ip = C \cdot \exp(-q \cdot Vq/ht)$$

where Vq is a potential barrier against holes disposed between the emitter and the base. In the conventional HBT of FIG. 23, the potential barrier Vq is approximately equivalent to $\Delta Eq + \Delta Ev$, i.e., the sum of a difference in band gaps due to the heterojunction and the discontinuity in the valence band. In the HBT with the emitter having the MQB structure of the present invention, it is possible to increase the potential barrier Vq by an amount equivalent to $\Delta Ev$, so that Vq is approximately equal to $\Delta Eq + \Delta Ev \times 2$. When the emitter comprises $Al_xGa_{1-x}As$ and the Al composition x is 0.3, at room temperature, the reverse injected hole current Ip of the HBT of this embodiment is about 1/100 of the reverse injected hole current Ip of the conventional HBT with no MQB structure, which means that the current amplification factor $\beta$ is increased about hundredfold by including the MQB in the emitter.

While in the above-described ninth embodiment the heterojunction of the HBT is produced with GaAs and AlGaAs, other combinations of semiconductor materials that produce a heterojunction may be used with the same effects as described above. For example, the present invention may be applied to an HBT in which a heterojunction is produced by InP/InGaAs or AlInAs/GaInAs, or an HBT in which a heterojunction is produced by four-elemental InGaAsP or InAlGaAs.

In the above-described seventh to ninth embodiments, when the semiconductor layer including the MQB is formed, a crystal growth method capable of controlling the thickness of the semiconductor layer at an atomic layer level should be used. As the crystal growth method, MOCVD, MBE, gas source MBE, ALE, and the like are available.

As is evident from the foregoing description, according to the present invention, a high-speed semiconductor device includes an emitter layer serving as an injection source of hot electrons and a collector barrier layer disposed between a base layer and a collector layer, and the energy band potential profile of the collector barrier layer is gradually varied from a region in the vicinity of a boundary between the base layer and the collector barrier layer. Therefore, the reflection of an electron wave at the collector barrier layer is reduced. As the result, a RHET which ensures a high current density in its ON state and a sufficient P/V ratio in its practical use is achieved. In addition, a HET which ensures a high current density in its ON state is achieved.

In addition, according to the present invention, in a method of producing a high-speed semiconductor device including a collector barrier layer disposed between a base layer and a collector layer, the collector barrier layer is formed so that its material composition may be gradually varied from a region in the vicinity of a boundary between the base layer and the collector barrier layer. Therefore, a high-speed semiconductor device that can significantly reduce reflection of an electron wave at the collector barrier layer is produced with high controllability.

In addition, according to the present invention, a high-speed semiconductor device includes an emitter layer serving as an injection source of hot electrons and a collector barrier layer disposed between a base layer and a collector layer. The collector barrier layer includes a multiquantum barrier comprising at least one barrier layer for preventing tunneling and a multiquantum well layer. Therefore, a RHET which ensures a high current density in its ON state and a sufficient P/V ratio in its practical use is achieved. In addition, a HET which ensures a high current density in its ON state is achieved.

In addition, according to the present invention, a hetero-bipolar-junction type high-speed semiconductor device includes a multiquantum barrier comprising at least one barrier layer for preventing tunneling and a multiquantum well layer, disposed in the emitter region near the base. Therefore, a HBT in which reverse-injected current is significantly reduced and a high current gain is obtained is achieved.

What is claimed is:

1. A high-speed semiconductor device comprising:
   an emitter layer, a base layer, and a collector layer successively disposed, said emitter layer serving as an injection source of hot electrons; and
   a collector barrier layer disposed between said base layer and said collector layer, said collector barrier layer having a band gap energy and a graded composition so that the band gap energy gradually decreases adjacent said base layer and adjacent said collector layer.

2. The high-speed semiconductor device of claim 1 comprising a resonant tunneling structure having at least one quantum well layer and two barrier layers sandwiching said quantum well layer for supporting resonant tunneling of charge carriers, said resonant tunneling structure being disposed between said emitter layer and said base layer.

3. The high-speed semiconductor device of claim 1 comprising a spacer layer disposed between said collector barrier layer and said collector layer.

4. The high-speed semiconductor device of claim 1 wherein said emitter layer, said base layer, and said collector layer all have the same conductivity type and energy band gap and including an intrinsic spacer layer having the same energy band gap as said emitter, base, and collector layers and disposed between said collector barrier layer and said collector layer.

* * * * *